United States Patent
Zhou et al.

(10) Patent No.: US 10,205,329 B2
(45) Date of Patent: Feb. 12, 2019

(54) INTELLIGENT CHARGER WITH DIAGNOSTIC FUNCTION AND CHARGING METHOD

(71) Applicants: XUZHOU HENGYUAN ELECTRICAL APPLIANCES CO.,LTD, Xuzhou (CN); CHINA UNIVERSITY OF MINING AND TECHNOLOGY, Xuzhou (CN)

(72) Inventors: Gongbo Zhou, Xuzhou (CN); Houlian Wang, Xuzhou (CN); Zhencai Zhu, Xuzhou (CN); Zhixiang Li, Xuzhou (CN); Wei Li, Xuzhou (CN); Guohua Cao, Xuzhou (CN)

(73) Assignees: XUZHOU HENGYUAN ELECTRICAL APPLIANCES CO., LTD, Xuzhou (CH); CHINA UNIVERSITY OF MINING AND TECHNOLOGY, Xuzhou (CN)

( * ) Notice: Subject to any disclaimer, the term of this patent is extended or adjusted under 35 U.S.C. 154(b) by 0 days.

(21) Appl. No.: 15/766,817

(22) PCT Filed: Dec. 28, 2015

(86) PCT No.: PCT/CN2015/099124
§ 371 (c)(1),
(2) Date: Apr. 8, 2018

(87) PCT Pub. No.: WO2017/059641
PCT Pub. Date: Apr. 13, 2017

(65) Prior Publication Data
US 2018/0219393 A1    Aug. 2, 2018

(30) Foreign Application Priority Data

Oct. 8, 2015 (CN) .......................... 2015 1 0662209

(51) Int. Cl.
*H02J 7/00* (2006.01)
*H02J 7/14* (2006.01)
*G01R 31/36* (2006.01)

(52) U.S. Cl.
CPC ........ *H02J 7/0029* (2013.01); *G01R 31/3634* (2013.01); *G01R 31/3679* (2013.01);
(Continued)

(58) Field of Classification Search
USPC ........ 320/107, 109, 116, 118, 134, 110, 112, 320/113, 114, 120, 125, 128, 132, 136,
(Continued)

(56) References Cited

U.S. PATENT DOCUMENTS

| 2002/0008523 A1* | 1/2002 | Kiang ................ G01R 31/3631 324/429 |
| 2003/0137277 A1* | 7/2003 | Mori ................... G01R 31/3648 320/132 |

(Continued)

FOREIGN PATENT DOCUMENTS

CN    101312293 A    11/2008
CN    101814748 A     8/2010

*Primary Examiner* — Alexis B Pacheco
(74) *Attorney, Agent, or Firm* — Gokalp Bayramoglu

(57) ABSTRACT

An intelligent charger with a diagnostic function and a charging method. The intelligent charger includes a control module, a diagnosis module, a charging module, a multi-path switch and a detection module. The control module is sequentially connected to the diagnosis module, the charging module and the multi-path switch; and the detection module is sequentially connected to an external connection terminal of a battery, the multi-path switch and the fault diagnosis module. The charging method includes a charging mode and a diagnosis mode; the diagnosis mode includes a two part function, namely fault diagnosis and lifetime detection; the fault diagnosis is detecting a fault problem which can occur in the battery and providing a prompt; and the (Continued)

lifetime detection is detecting the current capacity of a battery, and determining current battery life through the ratio of current capacity to rated capacity.

8 Claims, 4 Drawing Sheets

(52) U.S. Cl.
CPC ............... *H02J 7/00* (2013.01); *H02J 7/007* (2013.01); *H02J 7/0047* (2013.01); *H02J 2007/0049* (2013.01)

(58) Field of Classification Search
USPC .......................................................... 320/137
See application file for complete search history.

(56) References Cited

U.S. PATENT DOCUMENTS

| | | | | |
|---|---|---|---|---|
| 2005/0040792 A1* | 2/2005 | Nair | ................. | H02J 7/0031 320/162 |
| 2006/0192529 A1* | 8/2006 | Kimura | ................. | H02J 7/0026 320/116 |
| 2009/0206841 A1* | 8/2009 | Weng | ................. | G01R 31/3658 324/426 |
| 2011/0196545 A1* | 8/2011 | Miwa | ................. | B60K 6/365 700/292 |
| 2011/0260687 A1* | 10/2011 | Kudo | ................. | H01M 10/425 320/118 |
| 2012/0001588 A1* | 1/2012 | Kita | ................. | H02J 7/0047 320/107 |
| 2012/0169290 A1* | 7/2012 | Nakashima | ........... | H01M 10/44 320/134 |
| 2012/0191288 A1* | 7/2012 | Qi | ................. | F01N 11/007 701/29.1 |
| 2013/0264869 A1* | 10/2013 | Klinkig | ................. | B60R 16/03 307/10.6 |
| 2014/0159660 A1* | 6/2014 | Klose | ................. | B60L 11/1838 320/109 |
| 2014/0306658 A1* | 10/2014 | Kinomura | ........... | B60L 11/1838 320/109 |
| 2015/0070023 A1* | 3/2015 | Kudo | ................. | H01M 10/482 324/426 |
| 2015/0077239 A1* | 3/2015 | Litjen | ................. | B60L 11/1818 340/455 |
| 2015/0097526 A1* | 4/2015 | DeDona | ............. | B60L 11/1838 320/109 |
| 2015/0333544 A1* | 11/2015 | Toya | ................. | H01M 10/48 320/112 |

* cited by examiner

INTELLIGENT CHARGER WITH DIAGNOSTIC FUNCTION AND CHARGING METHOD

CROSS REFERENCE TO RELATED APPLICATIONS

This application is national phase entry of international application PCT/CN2015/099124, filed on Dec. 28, 2015, which claims priority to Chinese Patent Application No. 201510662209.9, filed on Oct. 8, 2015, which is hereby incorporated by reference in its entirety.

TECHNICAL FIELD

The present invention relates to an intelligent charger and a charging method, and in particular, to an intelligent charger with a diagnostic function and a charging method.

BACKGROUND

As a power source of an electric car, a power battery is unavoidably subjected to various faults or aging in actual use due to a complicated working environment and changing operating conditions. Once the fault is not detected or handled timely, a safety incident may happen.

Currently, there are related patents on battery fault diagnosis and battery chargers. However, these patents have some deficiencies. When an electric car is charged at night, there is still a large amount of time that can be used after the car is fully charged, but normal chargers just ignore this period of time. It is cumbersome and inconvenient for a user to purchase a battery fault diagnosis device and keep it in use.

SUMMARY

Objectives of the present invention are to provide an intelligent charger with a diagnostic function and a charging method, so as to solve the problems that an existing battery charger does not have a battery fault diagnosis function, and it is cumbersome and inconvenient to additionally provide a battery fault diagnosis device.

The objectives of the present invention are achieved as follows.

To achieve the foregoing objectives of the present invention, the present invention adopts the following technical solutions. An intelligent charger includes: a control module, a diagnosis module, a charging module, a multi-path switch, and a detection module, where the control module is sequentially connected to the diagnosis module, the charging module, and the multi-path switch; and the detection module is sequentially connected to an external connection terminal of a battery, the multi-path switch and the fault diagnosis module.

The control module includes a microcontroller, a mode selection button, and an LCD display screen, where the mode selection button, the microcontroller and the LCD display screen are sequentially connected; an input end of the microcontroller is connected to the diagnosis module, and an output end of the microcontroller is connected to the charging module.

The diagnosis module includes a fault identification unit and a capacity measurement unit, where output ends of the fault identification unit and the capacity measurement unit are separately connected to the input end of the microcontroller of the control module, an input end of the fault identification unit is connected to the detection module, and an input end of the capacity measurement unit is connected to the multi-path switch, the fault identification unit storing a current-voltage curve of charging and discharging under various fault conditions of the battery.

The charging module includes a charging unit, where an input end of the charging unit is connected to the output end of the microcontroller of the control module, and an output end of the charging unit is connected to the multi-path switch.

The detection module includes a voltage sensor and a current sensor, where the voltage sensor is connected across two output ends of the multi-path switch, an output end of the voltage sensor is connected to an input end of a diagnosis unit of the diagnosis module, the current sensor is connected in series to an output line of the multi-path switch, and an output end of the current sensor is connected to the input end of the diagnosis unit of the diagnosis module.

A charging method has two modes: a charging mode and a diagnosis mode. A charging function of the charging mode is implemented through charging under conversion of constant current to constant voltage like an ordinary charger, or through stage-wise charging for different power batteries. The diagnosis mode includes two functions, namely fault diagnosis and lifetime detection, where the fault diagnosis is detecting a fault problem which may occur in the battery and providing a prompt; and the lifetime detection is detecting the current capacity of the battery, and determining current battery life through the ratio of the current capacity to rated capacity.

The charging mode or the diagnosis mode is chosen with a button. If the charging mode is chosen, charging steps are as follows:

A1: controlling, by a microcontroller, connection of pins 4 and 7, and connection of pins 5 and 6 of a multi-path switch; and a charging unit being connected to an external battery pack to implement charging;

A2: detecting, by a current sensor, the magnitude of a current; and proceeding to step A1 if the current is greater than 0.1 C, or to the next step if the current is less than 0.1 C;

A3: controlling, by the microcontroller, disconnection of pins 4 and 7, and disconnection of pins 5 and 6 of the multi-path switch, such that the charging unit is disconnected from the battery pack; and A4: displaying, by an LCD, completion of the charging.

If the diagnosis mode is chosen, diagnosis steps are as follows:

B1: controlling, by a microcontroller, connection of pins 4 and 7, and connection of pins 5 and 6 of a multi-path switch; and a charging unit being connected to an external battery pack to implement charging;

B2: detecting, by a current sensor, the magnitude of a current; and proceeding to step B1 if the current is greater than 0.1 C, or to the next step if the current is less than 0.1 C;

B3: controlling, by the microcontroller, connection of pins 1 and 7, and connection of pins 2 and 6 of the multi-path switch; and a capacity measurement unit being connected to the external battery pack to implement discharging;

B4: discharging, by the capacity measurement unit, the battery at a constant current; and starting, by a control module, recording of the time duration of the discharging;

B5: sending, by a detection module, detected current and voltage data to a fault identification unit in which a charging/discharging curve of the battery with various types of faults is set; and comparing, by the fault identification unit, the received data with the internally set fault curve, to identify and determine a battery fault type in a discharge status;

B6: detecting, by a voltage sensor, the magnitude of a voltage; and proceeding to step B3 when a voltage value is greater than a discharge cut-off voltage, or to step B7 when a voltage value is equal to a discharge cut-off voltage;

B7: dividing a capacity measured by the capacity measurement unit by a rated capacity, to obtain battery life, and displaying data on an LCD;

B8: controlling, by the microcontroller, disconnection of the pins 1 and 7, and disconnection of the pins 2 and 6 of the multi-path switch, that is, disconnecting a discharge loop; and controlling connection of the pins 4 and 7, and connection of the pins 5 and 6 of the multi-path switch, to connect a charging loop;

B9: measuring, by the detection module, voltage and current data, and sending the measured data to the fault identification unit; comparing, by the fault identification unit, the received data with the internally set fault curve again, to identify and determine a battery fault type in a charging status; synthetically determining the battery fault types in combination with step B5, and forwarding the determined battery fault types to the microcontroller;

B10: detecting, by the current sensor, the magnitude of the current; and proceeding to step B8 if the current is greater than 0.1 C, or to the next step if the current is less than 0.1 C; and B11: displaying, by the LCD, full charging of the battery.

Beneficial effects are as follows: Because the foregoing technical solutions are used, the intelligent charger supports a mode selection function, and selection can be made between a charging mode and a diagnosis mode according to requirements of the user. The control module controls, according to a user selection, different switches to perform a switch between the two modes. In the charging mode, a common charging method is used, such as charging under conversion of constant current to constant voltage or three-phase charging. In the diagnosis mode, three successive actions of charging, discharging, and charging need to be performed on the battery. Capacity measurement is completed in a discharge process using the ampere-hour integral method, and fault identification is implemented based on the two processes of discharging and charging. As such, the two functions of fault diagnosis and charging of the battery are integrated by means of intelligent control.

The advantages are as follows: The present invention has both a charging function and a diagnosis function, and can measure the battery life and the type of the failure. Therefore, the charger of the present invention is a multi-purpose charger. Remaining charge time of the battery at night is fully utilized, and selection can be made among a plurality of modes according to the requirements of the user, thus achieving monitoring of battery life and the health state of the battery, and guaranteeing security for power sources of electric cars.

DETAILED DESCRIPTION

Figure 1:
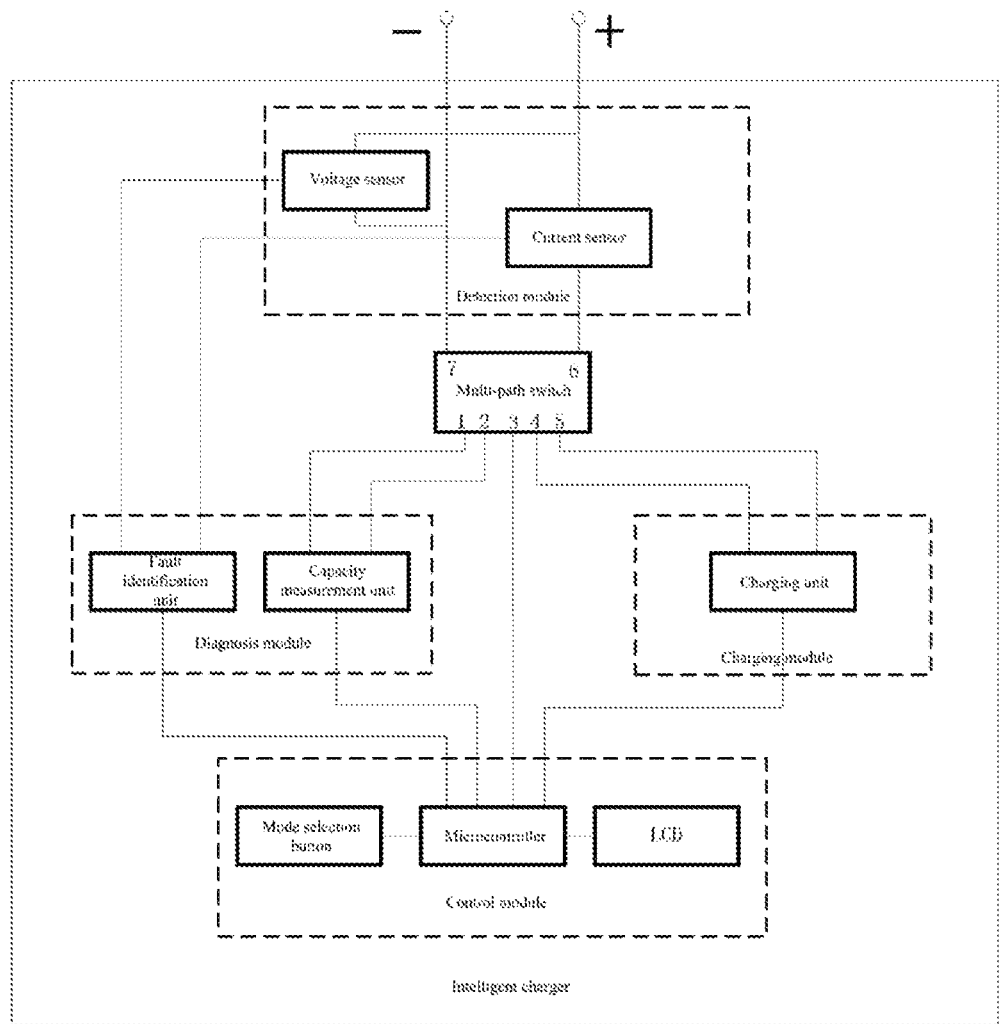
FIG. 1 is an internal structural diagram of an intelligent charger with a diagnostic function according to the present invention.
Figure 2:
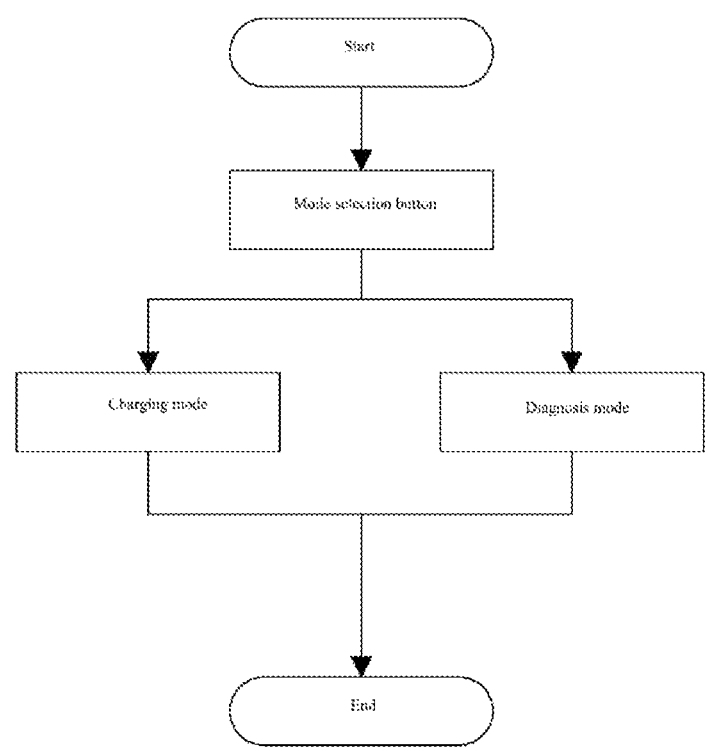
FIG. 2 is a flowchart of mode selection according to the present invention.
Figure 3:
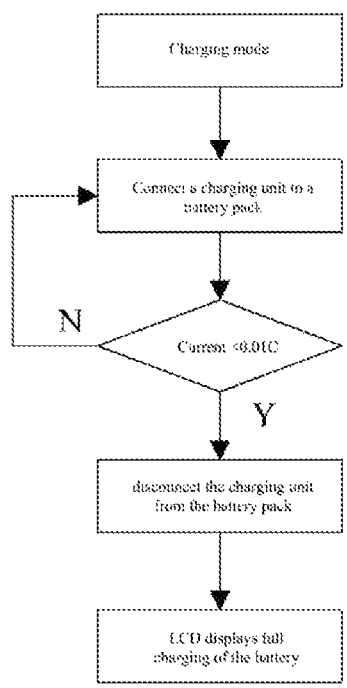
FIG. 3 is a flowchart of operations in a charging mode according to the present invention.
Figure 4:
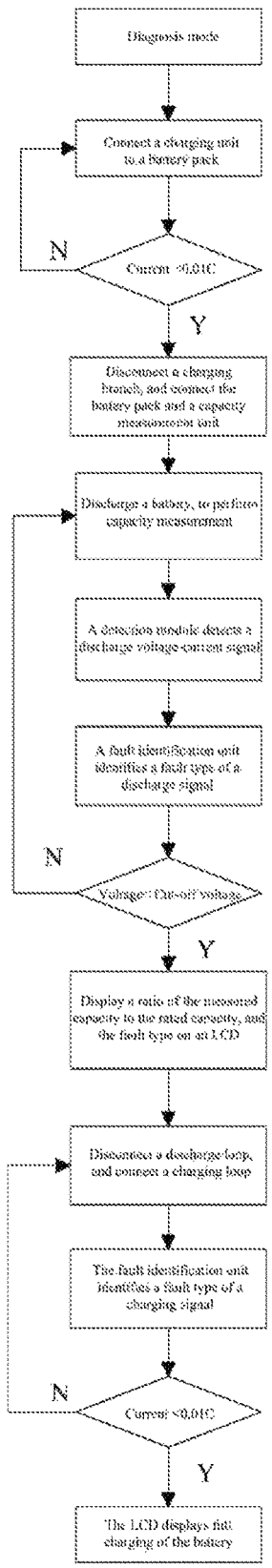
FIG. 4 is a flowchart of operations in a diagnosis mode according to the present invention.

The present invention will be described in detail below with reference to the specific embodiment.

Embodiment 1 An intelligent charger includes: a control module, a diagnosis module, a charging module, a multi-path switch, and a detection module, where the control module is sequentially connected to the diagnosis module, the charging module, and the multi-path switch; and the detection module is sequentially connected to an external connection terminal of a battery, the multi-path switch and the fault diagnosis module.

The control module includes a microcontroller, a mode selection button, and an LCD display screen, where the mode selection button, the microcontroller and the LCD display screen are sequentially connected; an input end of the microcontroller is connected to the diagnosis module, and an output end of the microcontroller is connected to the charging module.

The diagnosis module includes a fault identification unit and a capacity measurement unit, where output ends of the fault identification unit and the capacity measurement unit are separately connected to the input end of the microcontroller of the control module, an input end of the fault identification unit is connected to the detection module, and an input end of the capacity measurement unit is connected to the multi-path switch, the fault identification unit storing a current-voltage curve of charging and discharging under various fault conditions of the battery.

The charging module includes a charging unit, where an input end of the charging unit is connected to the output end of the microcontroller of the control module, and an output end of the charging unit is connected to the multi-path switch.

The detection module includes a voltage sensor and a current sensor, where the voltage sensor is connected across two output ends of the multi-path switch, an output end of the voltage sensor is connected to an input end of a diagnosis unit of the diagnosis module, the current sensor is connected in series to an output line of the multi-path switch, and an output end of the current sensor is connected to the input end of the diagnosis unit of the diagnosis module.

A charging method has two modes: a charging mode and a diagnosis mode. A charging function of the charging mode is implemented through charging under conversion of constant current to constant voltage like an ordinary charger, or through stage-wise charging for different power batteries. The diagnosis mode includes two functions, namely fault diagnosis and lifetime detection, where the fault diagnosis is detecting a fault problem which may occur in the battery and providing a prompt; and the lifetime detection is detecting the current capacity of the battery, and determining current battery life through the ratio of the current capacity to rated capacity.

The charging mode or the diagnosis mode is chosen with a button. If the charging mode is chosen, charging steps are as follows:

A1: A microcontroller controls connection of pins 4 and 7, and connection of pins 5 and 6 of a multi-path switch; and a charging unit is connected to an external battery pack to implement charging.

A2: A current sensor detects the magnitude of a current; and the process proceeds to step A1 if the current is greater than 0.1 C, or to the next step if the current is less than 0.1 C.

A3: The microcontroller controls disconnection of pins 4 and 7, and disconnection of pins 5 and 6 of the multi-path switch, such that the charging unit is disconnected from the battery pack.

A4: An LCD displays completion of the charging.

If the diagnosis mode is chosen, diagnosis steps are as follows:

B1: A microcontroller controls connection of pins 4 and 7, and connection of pins 5 and 6 of a multi-path switch; and a charging unit is connected to an external battery pack to implement charging.

B2: A current sensor detects the magnitude of a current; and the process proceeds to step B1 if the current is greater than 0.1 C, or to the next step if the current is less than 0.1 C.

B3: The microcontroller controls connection of pins 1 and 7, and connection of pins 2 and 6 of the multi-path switch; and a capacity measurement unit is connected to the external battery pack to implement discharging.

B4: The capacity measurement unit discharges the battery at a constant current, and a control module starts recording of the time duration of the discharging.

B5: A detection module sends detected current and voltage data to a fault identification unit in which a charging/discharging curve of the battery with various types of faults is set; and the fault identification unit compares the received data with the internally set fault curve, to identify and determine a battery fault type in a discharge status.

B6: A voltage sensor detects the magnitude of a voltage; and the process proceeds to step B3 when a voltage value is greater than a discharge cut-off voltage, or to step B7 when a voltage value is equal to a discharge cut-off voltage.

B7: A capacity measured by the capacity measurement unit is divided by a rated capacity, to obtain battery life, and data is displayed on an LCD.

B8: The microcontroller controls disconnection of the pins 1 and 7, and disconnection of the pins 2 and 6 of the multi-path switch, that is, the microcontroller disconnects a discharge loop; and controls connection of the pins 4 and 7, and connection of the pins 5 and 6 of the multi-path switch, to connect a charging loop.

B9: The detection module measures voltage and current data, and sends the measured data to the fault identification unit; the fault identification unit compares the received data with the internally set fault curve again, to identify and determine a battery fault type in a charging status. The fault identification unit synthetically determines battery fault types in combination with step B5, and forwards the determined battery fault types to the microcontroller.

B10: The current sensor detects the magnitude of the current; and the process proceeds to step 138 if the current is greater than 0.1 C, or to the next step if the current is less than 0.1 C.

B11: The LCD displays full charging of the battery.

What is claimed is:

1. An intelligent charger with a diagnostic function, comprising: a control module, a diagnosis module, a charging module, a multi-path switch, and a detection module; wherein, the control module is sequentially connected to the diagnosis module, the charging module, and the multi-path switch; and the detection module is sequentially connected to an external connection terminal of a battery, the multi-path switch and the diagnosis module; the diagnosis module comprises a fault identification unit and a capacity measurement unit; output ends of the fault identification unit and the capacity measurement unit are separately connected to an input end of a microcontroller of the control module; and an input end of the fault identification unit is connected to the detection module, and an input end of the capacity measurement unit is connected to the multi-path switch; wherein, the fault identification unit stores a current-voltage curve of charging and discharging under various fault conditions of the battery; and the charging module comprises a charging unit, wherein an input end of the charging unit is connected to the output end of the microcontroller of the control module, and an output end of the charging unit is connected via the multi-path switch to the battery.

2. A charging method of an intelligent charger with a diagnostic function, wherein the intelligent charger comprises a control module, a diagnosis module, a charging module, a multi-path switch, and a detection module; wherein the control module is sequentially connected to the diagnosis module, the charging module, and the multi-path switch; and the detection module is sequentially connected to an external connection terminal of a battery, the multi-path switch and the diagnosis module; and the control module comprises a microcontroller, a mode selection button and an LCD display screen; the diagnosis module comprises a fault identification unit and a capacity measurement unit, wherein the fault identification unit stores a current-voltage curve of charging and discharging under various fault conditions of the battery; the charging module comprises a charging unit and the detection module comprises a voltage sensor and a current sensor;

the charging method comprises two modes: a charging mode and a diagnosis mode; a charging function of the charging mode is implemented through charging under conversion of a constant current to a constant voltage like an ordinary charger, or through a stage-wise charging for different power batteries; the diagnosis mode is configured for diagnosis and lifetime detection, wherein the diagnosis is detecting a fault problem occurring in the battery and providing a prompt; and the lifetime detection is detecting a current capacity of the battery, and determining a current battery life through a ratio of the current capacity to a rated capacity, wherein the charging mode or the diagnosis mode is chosen with the mode selection button, and if the charging mode is chosen, charging steps are as follows:

A1: controlling, by the microcontroller, connection of a first pin and a second pin, and connection of a third pin and a fourth pin of a multi-path switch; such that a charging unit is connected to an external battery pack to implement charging;

A2: detecting, by the current sensor, the magnitude of a current; and proceeding to the step A1 if the current is greater than 0.1 C, or to a next step if the current is less than 0.1 C;

A3: controlling, by the microcontroller, disconnection of the first pin and the second pin, and disconnection of the third pin and the fourth pin of the multi-path switch, such that the charging unit is disconnected from the battery pack; and A4: displaying, by the LCD display screen, completion of the charging; or if the diagnosis mode is chosen, diagnosis steps are as follows:

B1: controlling, by a microcontroller, connection of the first pin and the second pin, and connection of the third pin and the fourth pin of a multi-path switch; such that the charging unit is connected to an external battery pack to implement charging;

B2: detecting, by the current sensor, the magnitude of a current; and proceeding to step B1 if the current is greater than 0.1 C, or to a next step if the current is less than 0.1 C;

B3: controlling, by the microcontroller, connection of a fifth pin and the second pin, and connection of a sixth pin and the fourth pin of the multi-path switch; such that the capacity measurement unit is connected to the external battery pack to implement discharging;

B4: discharging, by the capacity measurement unit, the battery at a constant current; and starting, by a control module, recording of the time duration of the discharging;

B5: sending, by the detection module, detected current and voltage data to a fault identification unit in which a charging/discharging curve of the battery with various types of faults is set; and comparing, by the fault identification unit, the received data with the internally set fault curve, to identify and determine a battery fault type in a discharge status;

B6: detecting, by the voltage sensor, the magnitude of a voltage; and proceeding to the step B3 when a voltage value is greater than a discharge cut-off voltage, or to the step B7 when a voltage value is equal to a discharge cut-off voltage;

B7: dividing a capacity measured by the capacity measurement unit by a rated capacity, to obtain battery life, and displaying the data on the LCD display screen;

B8: controlling, by the microcontroller, disconnection of the fifth pin and the second pin, and disconnection of the sixth pin and the fourth pin of the multi-path switch, that is, disconnecting a discharge loop; and controlling connection of the first pin and the second pin, and connection of the third pin and the fourth pin of the multi-path switch, to connect a charging loop;

B9: measuring, by the detection module, voltage and current data, and sending the measured data to the fault identification unit; comparing, by the fault identification unit, the received data with the internally set fault curve again, to identify and determine a battery fault type in a charging status; synthetically determining the battery fault types in combination with the step B5, and forwarding the determined battery fault types to the microcontroller;

B10: detecting, by the current sensor, the magnitude of the current; and proceeding to the step B8 if the current is greater than 0.1 C, or to a next step if the current is less than 0.1 C; and B11: displaying, by the LCD display screen, full charging of the battery.

3. The intelligent charger with the diagnostic function according to claim 1, wherein the control module comprises a microcontroller, a mode selection button and an LCD display screen; and wherein the mode selection button, the microcontroller and the LCD display screen are sequentially connected; and an input end of the microcontroller is connected to the diagnosis module, and an output end of the microcontroller is connected to the charging module.

4. The intelligent charger with the diagnostic function according to claim 1, wherein the detection module comprises a voltage sensor and a current sensor, and wherein the voltage sensor is connected across two output ends of the multi-path switch, an output end of the voltage sensor is connected to an input of a diagnosis unit of the diagnosis module, the current sensor is connected in series to an output line of the multi-path switch, and an output end of the current sensor is connected to the input end of the diagnosis unit of the diagnosis module.

5. The charging method of the intelligent charger with the diagnostic function according to claim 2, wherein the mode selection button, the microcontroller and the LCD display screen are sequentially connected; and an input end of the microcontroller is connected to the diagnosis module, and an output end of the microcontroller is connected to the charging module.

6. The charging method of the intelligent charger with the diagnostic function according to claim 2, wherein output ends of the fault identification unit and the capacity measurement unit are separately connected to an input end of a microcontroller of the control module; and an input end of the fault identification unit is connected to the detection module, and an input end of the capacity measurement unit is connected to the multi-path switch.

7. The charging method of the intelligent charger with the diagnostic function according to claim 2, wherein an input end of the charging unit is connected to the output end of the microcontroller of the control module, and an output end of the charging unit is connected to the multi-path switch.

8. The charging method of the intelligent charger with the diagnostic function according to claim 2, wherein the voltage sensor is connected across two output ends of the multi-path switch, an output end of the voltage sensor is connected to an input of a diagnosis unit of the diagnosis module, the current sensor is connected in series to an output line of the multi-path switch, and an output end of the current sensor is connected to the input end of the diagnosis unit of the diagnosis module.

* * * * *